(12) United States Patent
Feiler (10) Patent No.: US 6,794,689 B1
(45) Date of Patent: Sep. 21, 2004

(54) HIGH VOLTAGE SEMICONDUCTOR COMPONENT

(75) Inventor: Wolfgang Feiler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/554,800

(22) PCT Filed: Nov. 16, 1998

(86) PCT No.: PCT/DE98/03363

§ 371 (c)(1),
(2), (4) Date: Sep. 5, 2000

(87) PCT Pub. No.: WO99/26295

PCT Pub. Date: May 27, 1999

(30) Foreign Application Priority Data

Nov. 18, 1997 (DE) .......................................... 197 50 992

(51) Int. Cl.[7] ........................ H01L 29/74; H01L 31/111
(52) U.S. Cl. ........................................................ 257/107
(58) Field of Search ................................ 257/122, 162, 257/163, 343, 423, 556, 107, 139, 140, 411, 142, 143, 144, 147; 438/316, 325, 335, 204, 236

(56) References Cited

U.S. PATENT DOCUMENTS

| 5,395,776 A | | 3/1995 | Shibib | |
| 5,485,023 A | * | 1/1996 | Sumida | ...................... 257/139 |
| 5,631,494 A | | 5/1997 | Sakurai | |
| 5,767,538 A | * | 6/1998 | Mullins et al. | ............. 257/115 |

FOREIGN PATENT DOCUMENTS

| DE | 40 20 478 | 1/1991 |
| EP | 0 372 391 | 6/1990 |

OTHER PUBLICATIONS

Zuxin Qin and E.M. Sankara Narayanan, A Novel Approach to Improve LIGBT Performance, 1997 IEEE, pp. 313–316.*
Pattanayak D N et al., "n–channel lateral insulated gate transistors. I. Steady–state characteristics" IEEE Transactions On Electron Devices, Dec. 1986, USA, Bd. ED–33, Nr. 12, pp. 1956–1963.
Ravishankar Sunkavalli et al.: "High Temperature Performance of Dielectrically Isolated LDMOSFET, LIGBT and LEST" Proceedings of the International Electron Devices Meeting, Washington, Dec. 5–8, 1993, Dec. 5, 1993, pp. 683–686.
Chan W W T et al.: "A Power of Technology With Excellent Cross–Talk Isolation" IEEE Electron Device Letters, Bd. 17, No. 10, Oct. 1996, pp. 467–469.
Chow T P et al.: "Interaction Between Monolithic, Junction–Isolated Lateral Insulated–Gate Bipolar Transistors" IEEE Transactions on Electron Devices, Bd. 38, No. 2, Feb. 1, 1991, pp. 310–315.

* cited by examiner

*Primary Examiner*—Long Pham
*Assistant Examiner*—Dana Farahani
(74) *Attorney, Agent, or Firm*—Kenyon & Kenyon (57) ABSTRACT

A semiconductor component for switching high currents. The semiconductor component includes an LIGBT arrangement having island-shaped p-wells and specially designed cathode regions for improving the latch-up strength of the semiconductor component.

17 Claims, 9 Drawing Sheets

HIGH VOLTAGE SEMICONDUCTOR COMPONENT

FIELD OF THE INVENTION

The present invention relates to a field-controlled semiconductor component.

BACKGROUND INFORMATION

In German Published Patent Application No. 39 42 640 is discussed a semiconductor component in which the latch-up strength of the component is limited by elevated hole current densities occurring at the corners of the p-well islands.

SUMMARY OF THE INVENTION

The semiconductor component according to an exemplary embodiment of the present invention has the advantage that high current densities can be switched even at high operating temperatures without latching or affecting adjacent integrated circuit arrangements (e.g., logic circuits). This is advantageous in particular when switching a current for ignition applications by a semiconductor component designed as a MOS component, where inductive loads are to be driven. The component according to an exemplary embodiment of the present invention the present invention also has a high breakdown voltage of several 100 V in the static off state as well as good on-state behavior, i.e., a voltage drop of only a few volts in the static on state and a current density on the order of approx. 100 A/cm$^2$ of component surface area. Furthermore, the component has a high pulse strength, i.e., it can handle a high voltage and a high current density at the same time. A special embodiment of cathode regions directly adjacent to an anode region has proven to be especially advantageous.

An arrangement of interruptions in the cathode region at its corners has proven especially advantageous.

Furthermore, a division of channel regions into two groups controlled via separate gates is also advantageous. This is advantageous in particular for internal voltage limiting (clamping).

In comparison with insulation with buried oxide layers, insulation of the component in the chip by p-walls arranged at the edge of the component permits inexpensive integration of several conductivity-modulated output stages having a high blocking ability (semiconductor components of the exemplary embodiments of to the present invention) or logic circuits on the same chip.

BRIEF DESCRIPTION OF THE DRAWINGS

FIG. 3za shows another embodiment of a p-well.
FIG. 3zb shows another embodiment of a p-well.
FIG. 3zc shows another embodiment of a p-well.
FIG. 3zd shows another embodiment of a p-well.

DETAILED DESCRIPTION

Figure 1:
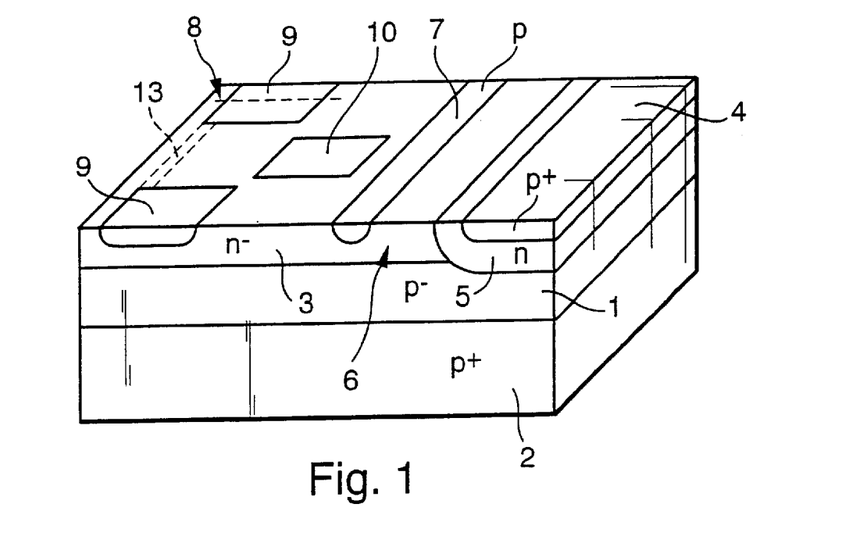
FIG. 1 shows a semiconductor component.
Figure 1A:
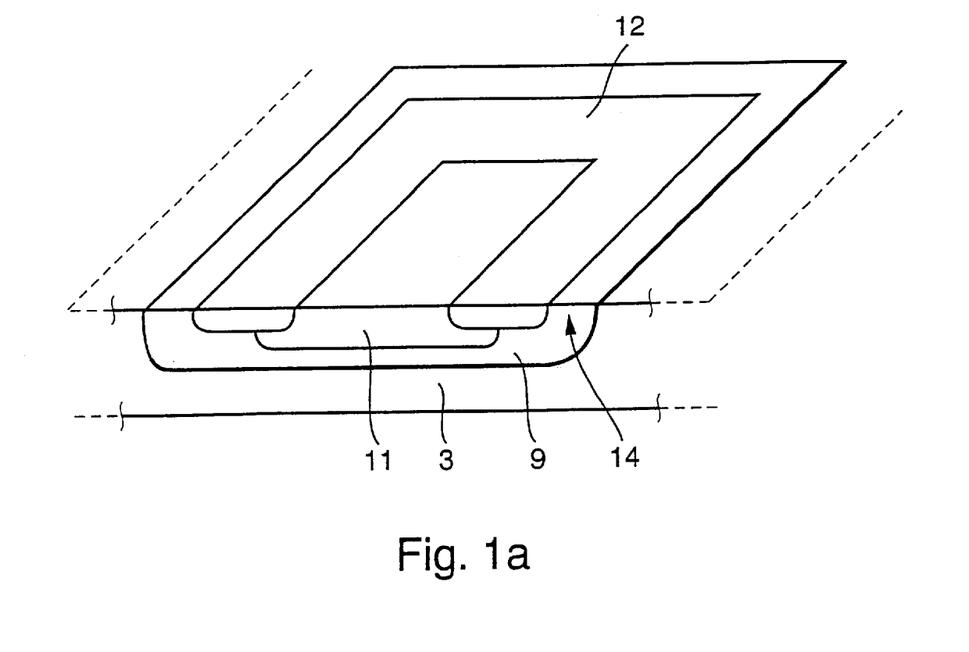
FIG. 1a shows a view of a p-well of the semiconductor component of FIG. 1.
Figure 2:
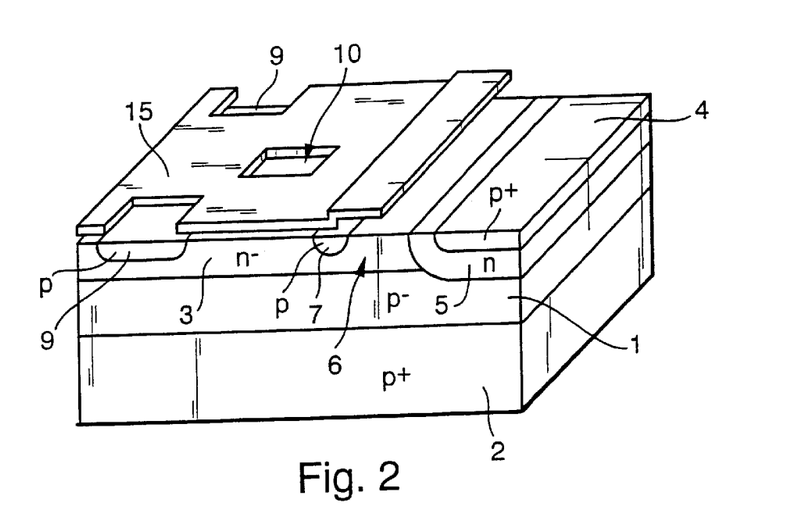
FIG. 2 shows a view of a semiconductor component having a gate electrode.
Figure 4:
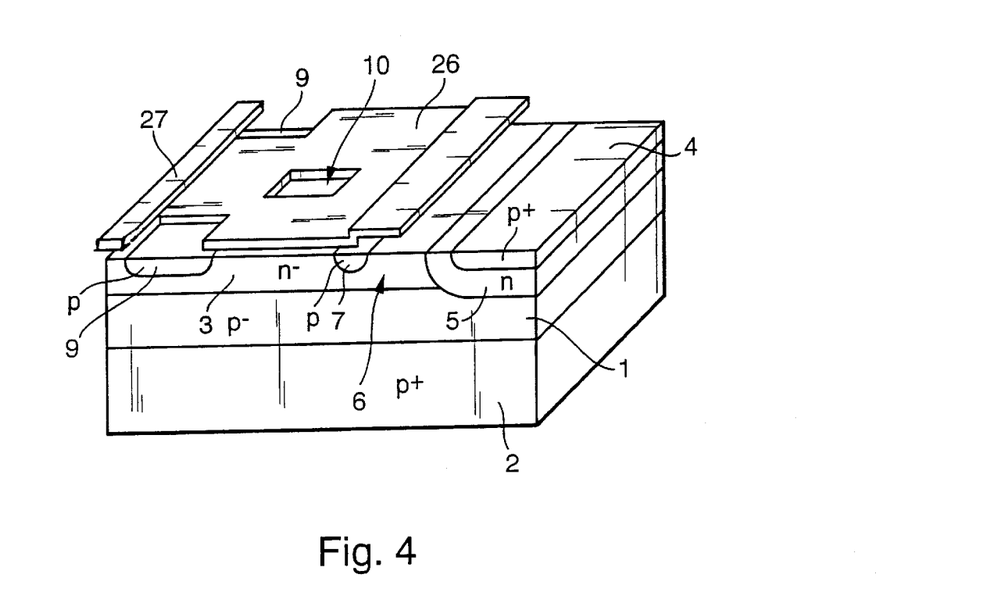
FIG. 4 shows a semiconductor component having two separate gate electrodes.

FIG. 1 shows a semiconductor component on a weakly p-doped layer 1 having a strongly p-doped layer 2 arranged on its rear side. A weakly doped n-region 3 arranged on the front side of the component has a strongly p-doped anode region 4 embedded in it and is in turn surrounded by a buffer zone 5 having n-type doping to differentiate it from n-doped layer 3 and weakly p-doped layer 1. A p-channel 7 optionally introduced into n-region 3 delineates a drift region 6 of n-region 3 from a region in which p-wells 9, 10 are arranged. Details of p-wells 9, 10 are shown along cross section 8 in FIG. 1a. A ring-shaped, strongly n-doped cathode region 12 introduced into p-well 9 parallel to the edge of the p-well encircles a strongly p-doped region 11 at the center of p-well 9. Regions of p-well 9 between cathode region 12 and the edge of p-wells 9 are referred to below as channel regions. Rounding of the corners of the channel regions which occurs due to outward diffusion in the production of the p-wells has not been shown here for the sake of simplicity. Optionally p-wells 9 facing away from anode region 4 and p-channel 7 are joined by a p-doped web 13 introduced into n-region 3 when an arrangement of gate electrodes is applied as shown in FIG. 4. With an arrangement of gate electrodes according to FIG. 2, there is no connection of p-wells 9 over such a p-web 13. The perspective view according to FIG. 1 can be continued to the right and left in mirror image, so that a parallel connection of multiple anode regions can be implemented, with more than one channel region being assigned to each anode region. This semiconductor component designed as a lateral-vertical-insulated gate bipolar transistor (LVIGBT) is metallized on its rear side which is strongly p-doped (region 2) and is at a reference potential (ground), as are cathode regions 12 and strongly p-doped regions 11 which are also connected to the reference potential by a metallization applied over these regions. FIG. 1 does not show this metallization. Metallization of strongly p-doped anode region 4, which is at a positive potential in forward operation, is not shown for the sake of simplicity. FIG. 2 shows the arrangement of gate electrode 15 of the semiconductor component, without showing the insulation layer between gate electrode 15 and the semiconductor body. Gate electrode 15, preferably made of polysilicon, covers n-region 3 and parts of p-wells 9. Gate electrode 15 completely covers channel regions 14 which partially overlap strongly n-doped cathode regions 12. This forms an electrode surface with recesses whose contours are adapted to the contours of the p-well or the n-cathode regions 12 arranged therein. Gate electrode 15 covers n-region 3 up to p-channel 7. P-channel 7 is partially overlapped and is covered by a field plate which is electrically connected to gate electrode 15 and is mounted at a greater distance from the semiconductor body than gate electrode 15. The field plate also covers parts of drift region 6 of n-region 3.

At a positive gate potential, inversion channels through which electrons enter drift region 6 are generated in channel region 14 of p-wells 9, 10. Then the anode region injects holes into the drift region so that a lateral current flow is established between the anode and cathode; at the same time a vertical current flow is established between the anode region and the rear side of the semiconductor component. P-channel 7 reduces field peaks at the edges of gate electrode 15.

Figure 3:
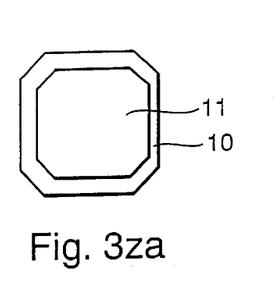
Figures 3A, 3B:
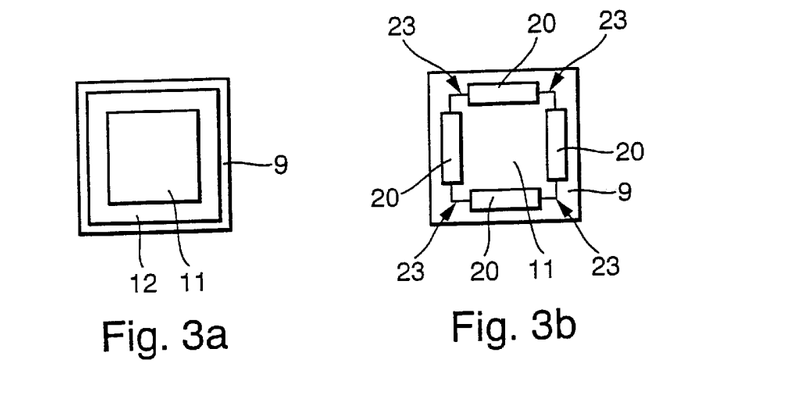
FIG. 3a shows another embodiment of a p-well.
FIG. 3b shows another embodiment of a p-well.
Figure 3C:
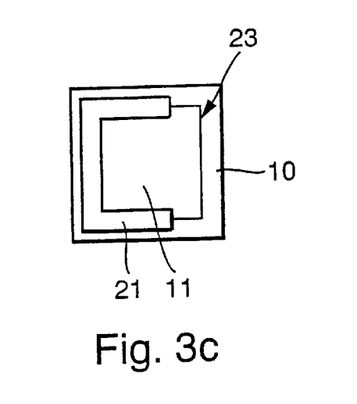
FIG. 3c shows another embodiment of a p-well.
Figure 3D:
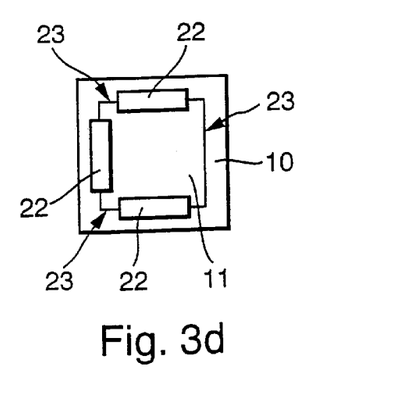
FIG. 3d shows another embodiment of a p-well.

FIGS. 3a–d show four embodiments of p-wells 9 and 10. FIG. 3a shows an arrangement of a p-well 9 having a closed ring-shaped cathode region 12 completely encircling a strongly p-doped region 11. FIG. 3b shows a p-well arrangement 9 according to an exemplary embodiment of the present invention of p-wells that are not arranged in immediate proximity to anode region 4. The p-well has multiple cathode regions separated from one another, labeled in their entirety with 20 as a cornerless cathode region. The arrangement according to FIG. 3b is derived from the idea of the arrangement according to FIG. 3a by removing strongly n-doped regions at locations 23. The border between p-well 9 and strongly p-doped region 11 introduced into the former can be seen at interruptions 23. FIG. 3c shows a p-well arrangement 10 according to an exemplary embodiment of the present invention for p-wells in immediate proximity to anode region 4. P-well 10 here has a U-shaped cathode region 12, which can be seen in FIG. 3a by omitting n-doped regions at location 23 where the border between strongly p-doped region 11 and p-well 10 can be seen again by analogy with FIG. 3b. Interruption 23 is oriented toward anode region 4. FIG. 3d shows another embodiment of a p-well region 10 in immediate proximity to anode region 4. Cornerless U-shaped cathode region 22 has multiple partial regions having interruptions 23 in the corners of p-well 10 and on the side facing anode region 4 where the border between strongly p-doped region 11 and p-well region 10 can be seen in the view illustrated here.

A latch-up in the semiconductor component described here is triggered by forward polarization of the n+/p+ junction between strongly p-doped region 11 and strongly n-doped region 12 in p-wells 9 and/or 10 as a result of current linkage of cathode region 12 through a hole current. To weaken this unwanted effect, p-well 10 does not have any region with strong n-doping on its edge adjacent to the drift region in the embodiment of p-wells according to an exemplary embodiment of the present invention (FIG. 3c or 3d). This yields a bypass for the hole current and increases the latch-up strength of the IGBT, because there is no strongly n-doped region which could lead to early latch-up precisely on the side with the highest hole current density. Because of their greater distance from drift region 6, a bypass at the edges can be omitted with the p-wells. Because of the geometry, however, there can also be high hole current densities in the corners of p-wells 9. This effect can be counteracted by two measures: first, by a mutually offset arrangement of the p-wells resembling a chessboard pattern, but also by hole bypasses in the corners of p-wells 9 and 10 (see FIGS. 3b and 3d). The latch-up strength is also increased by dividing the hole current among multiple p-wells and by the vertical current flow in the LVIGBT, especially in the case of a shutdown. The plurality of parallel-connected channel regions obtained due to the island structure and the ring-shaped arrangement of cathode region 12 guarantees good let-through current characteristics at the same time. The let-through current characteristic is good because the quotient of the circumference and the area of p-wells 9 and 10 is large, and also a plurality of islands can be arranged per anode region 4. The large value of this quotient is an expression of a good conductivity modulation in the area of the MOS control heads formed by the p-wells at a given channel resistance. The total channel resistance itself is low because a plurality of channel regions are connected in parallel. As already described in conjunction with FIG. 1, p-wells 9, 10 are connected to one another and to the reference potential by cathode metallization. The contacting is designed so that strongly p-doped regions 11 and cathode regions 12 are short-circuited together.

Figure 3E:
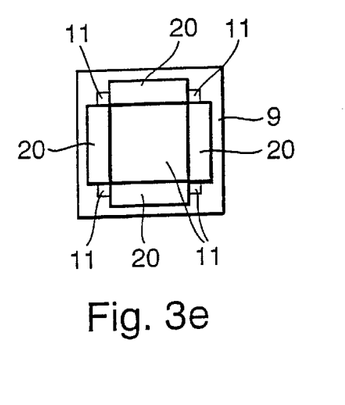
FIG. 3e shows another embodiment of a p-well.
Figure 3F:
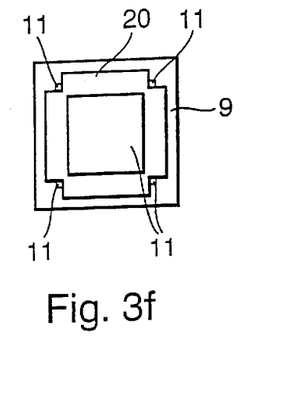
FIG. 3f shows another embodiment of a p-well.
Figure 3G:
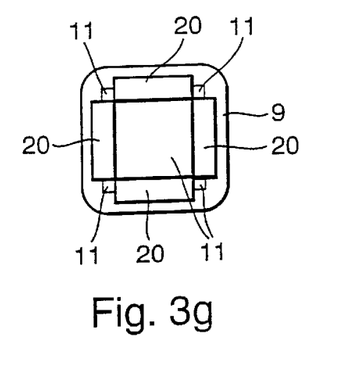
FIG. 3g shows another embodiment of a p-well.
Figure 3H:
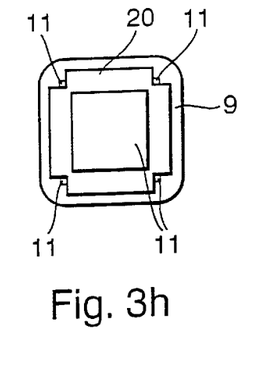
FIG. 3h shows another embodiment of a p-well.
Figure 3I:
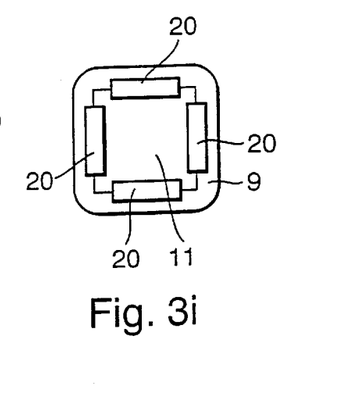
FIG. 3i shows another embodiment of a p-well.
Figures 3J, 3K:
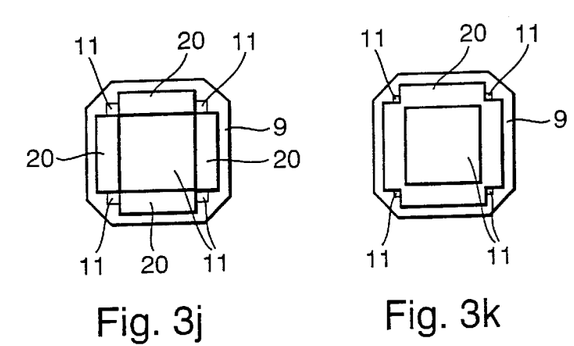
FIG. 3j shows another embodiment of a p-well.
FIG. 3k shows another embodiment of a p-well.
Figure 3L:
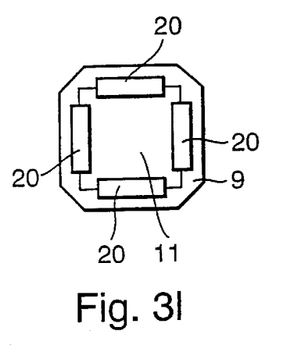
FIG. 3l shows another embodiment of a p-well.
Figure 3M:
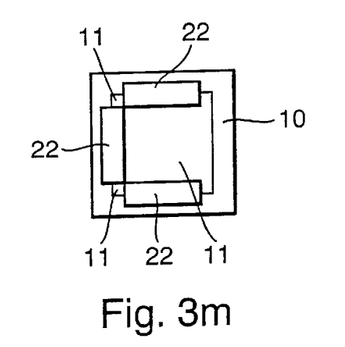
FIG. 3m shows another embodiment of a p-well.
Figure 3N:
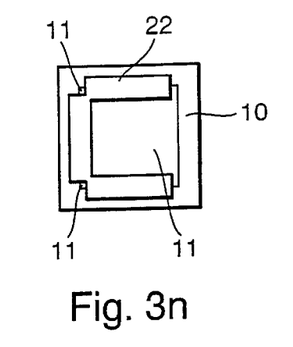
FIG. 3n shows another embodiment of a p-well.
Figure 3O:
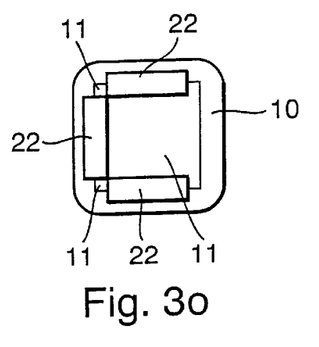
FIG. 3o shows another embodiment of a p-well.
Figure 3P:
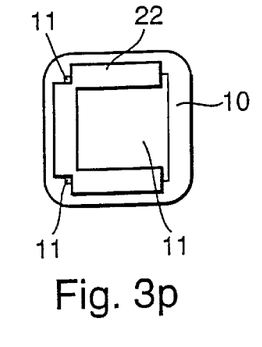
FIG. 3p shows another embodiment of a p-well.
Figure 3Q:
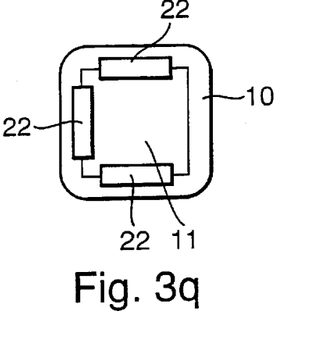
FIG. 3q shows another embodiment of a p-well.
Figure 3R:
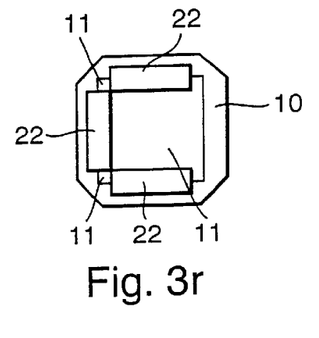
FIG. 3r shows another embodiment of a p-well.
Figure 3S:
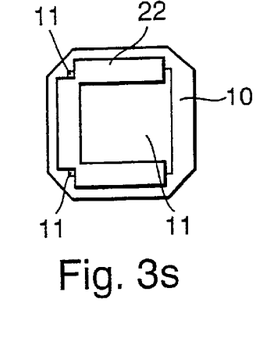
FIG. 3s shows another embodiment of a p-well.
Figure 3T:
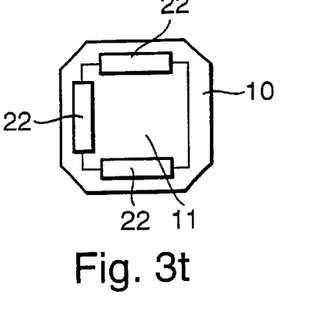
FIG. 3t shows another embodiment of a p-well.
Figure 3U:
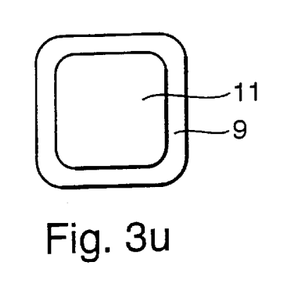
FIG. 3u shows another embodiment of a p-well.
Figure 3V:
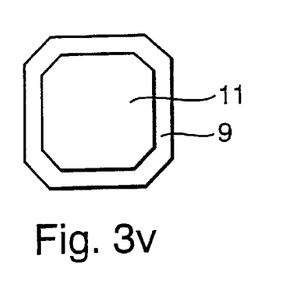
FIG. 3v shows another embodiment of a p-well.
Figure 3W:
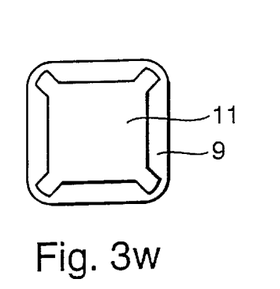
FIG. 3w shows another embodiment of a p-well.
Figure 3X:
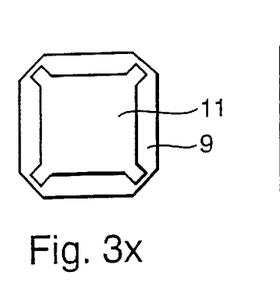
FIG. 3x shows another embodiment of a p-well.
Figure 3Y:
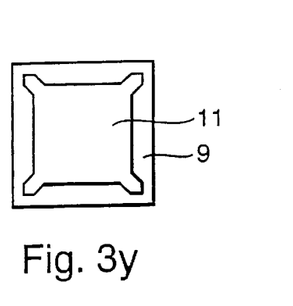
FIG. 3y shows another embodiment of a p-well.
Figure 3Z:
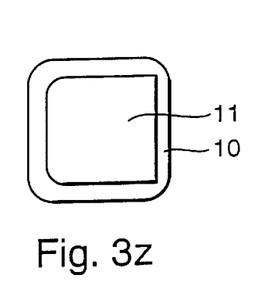
FIG. 3z shows another embodiment of a p-well.

FIGS. 3e–f show modifications of the embodiment according to FIG. 3b: n-regions 20 are slightly extended so they come into contact at the corners (FIG. 3e) or overlap slightly, forming a single cohesive n-region 20 (FIG. 3f); in the latter case, the interruptions have degenerated to recesses at the corners. FIGS. 3g–l show modifications of the embodiments according to FIGS. 3b, e and f, where p-well 9 has rounded or beveled corners associated with openings correspondingly beveled or rounded at the corners in gate electrode 15 or 26 above it. A higher breakdown voltage in comparison with an arrangement according to FIGS. 3a, b, e and f is advantageous here. FIGS. 3m–t show modifications of the arrangement according to FIG. 3d, by analogy with FIGS. 3e–l, all of which are modifications of the arrangement according to FIG. 3b. With both trough types 9 and 10, the corners of strongly p-doped regions 11 located in the middle may also be rounded or beveled (FIGS. 3u, v and z, za) or pulled through to the edge of the openings in gate electrodes 15 and 26 which define the shape of p-wells 9, 10 (FIGS. 3w, x, y and zb, zc, zd). It is advantageous here for region 11 to pull through on the entire side facing anode 4 in troughs 10 as far as the edge of the openings of the gate electrodes. To simplify the diagrams, only p-wells 9 and 10 and p-region 11 are shown in FIGS. 3u–zd.

FIG. 4 shows a LVIGBT component like that described in conjunction with FIG. 1, including p-web 13. In the manner already described in conjunction with FIG. 1, channel regions, in particular channel regions adjacent to anode region 4, can be controlled by a control gate 26, whereas channel regions more remote from drift region 6 and anode region 4 can be controlled by a clamp gate 27 electrically insulated from control gate 26.

LIGBT components having multiple parallel-connected channel regions per anode region permit a separation of gate control into a control gate and a clamp gate in general, where the MOS channel regions assigned to the gates each control the same anode region. Such a division can be used with strip-shaped p-wells, such as those described in German Published Patent Application 197 25 091, for example. The use of such a division in an electronic circuit is described in greater detail in conjunction with FIGS. 5a to 5c.

Figure 5A:
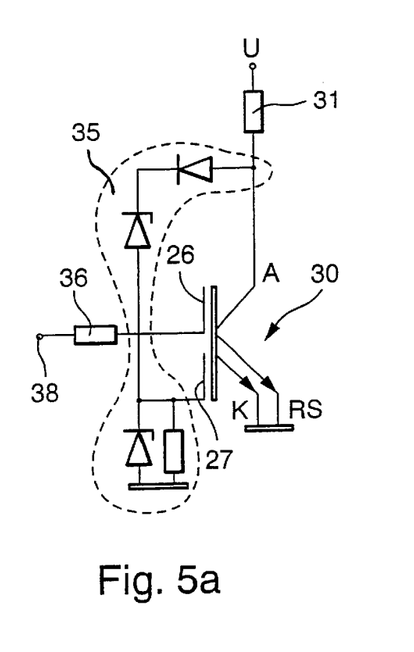
FIG. 5a shows a clamping circuit and a control circuit.
Figure 5B:
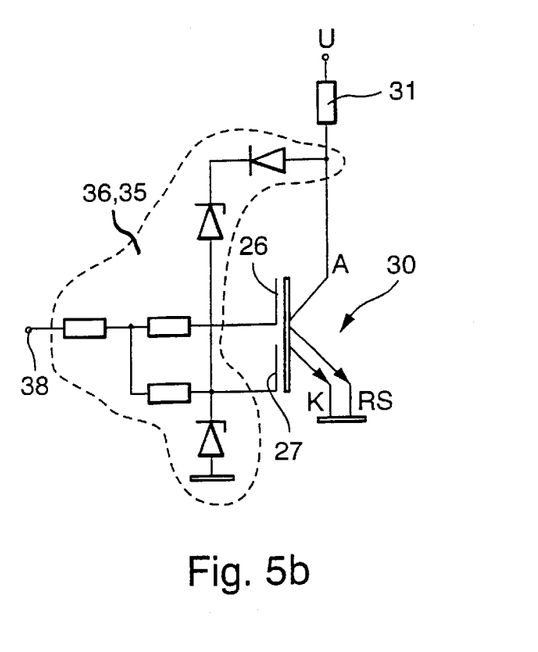
FIG. 5b shows another clamping circuit and control circuit.
Figure 5C:
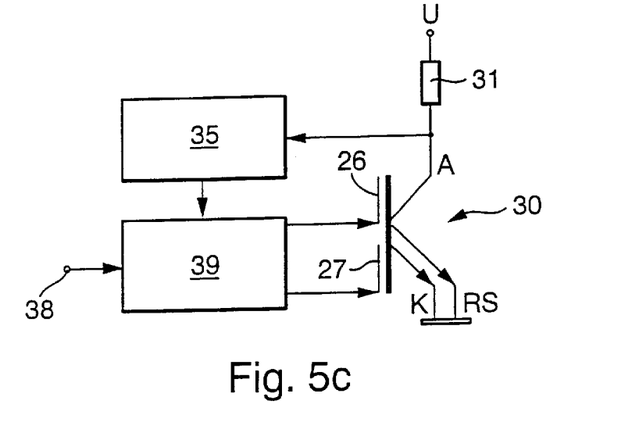
FIG. 5c shows another clamping circuit and control circuit.

FIGS 5a to 5c illustrate various embodiments of how a field-controlled semiconductor component having a separate control gate and clamp gate are tied into an electronic circuit. FIG. 5a shows an LIGBT 30 having an anode terminal A and a cathode terminal K plus a rear side terminal RS. The cathode terminal and rear side terminal are connected to ground. Anode terminal A is connected to a power supply voltage U by an inductive load 31. Component 30 is controlled over control gate 26 by a control circuit 36 designed as a resistor at whose input 38 a control signal can be applied. A clamp circuit 35 composed of a series connection of two Zener diodes and one diode and another resistor connects anode terminal A of the component to clamp gate 27. In FIG. 5b, control circuit 36 is fused with clamp circuit 35 to form a unit. A corresponding potential is applied to control gate 26 and clamp gate 27 over the control signal applied to control input 38 and the anode potential according to circuit 35, 36. FIG. 5c shows a generalized diagram of the control of control gate 26 and clamp gate 27 of LIGBT 30, where a clamp circuit 35 connected to anode terminal A is provided, its output signal is applied to control circuit 39 which processes the control signal applied to control input 38 together with the output signal of clamp circuit 35, applying suitable potentials to control gate 26 and clamp gate 27. As described above, a latch-up is triggered by a forward polarity of the n+/p+ junction in the p-wells due to the current linkage of the cathode region through a hole current. At a high inductance of load 31, high voltage peaks may occur at anode terminal A. To reduce the voltage peak rapidly without triggering a latch-up, the group of channel regions farther away from drift region 6 and/or anode region 4 may be controlled over clamp circuit 35 and clamp gate 27. This prevents a high hole current density in the p-wells close to the drift region and thus suppresses premature latch-up. On the other hand, these nearby p-wells 10 draw off some of the hole current, thus relieving the load on p-wells 9 remote from the drift region so that these p-wells carry most of the current in the case of voltage peaks at anode terminal A because of the greater control in comparison with the p-wells controlled over the control gate. FIG. 5a shows a complete separation of the clamp circuit and the control circuit in contrast with the embodiment according to FIG. 5b. FIG. 5c shows in a more general form a partial separation of the clamp circuit and control circuit with the advantage that it relieves the load on the control circuit, because the steep-edged signals occurring in the clamp circuit can be kept away from the control circuit. The latch-up strength is also increased by the vertical current flow occurring in the LVIGBT in particular in a shutdown case and in a clamp case. This current component flowing from the anode region to the rear side leads to relief of the load on the lateral current path for a given anode current density and is especially high in a shutdown case and in a clamp case.

Figure 6:
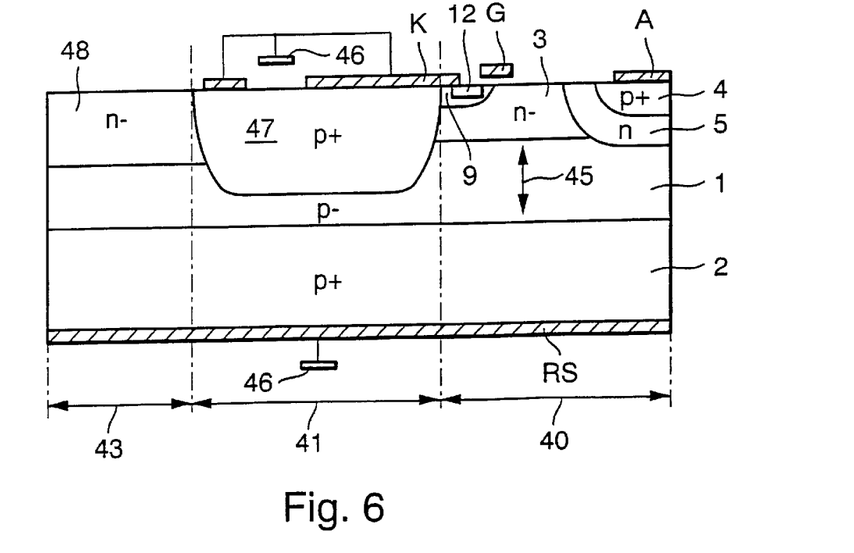
FIG. 6 shows an insulation arrangement.
Figure 7:
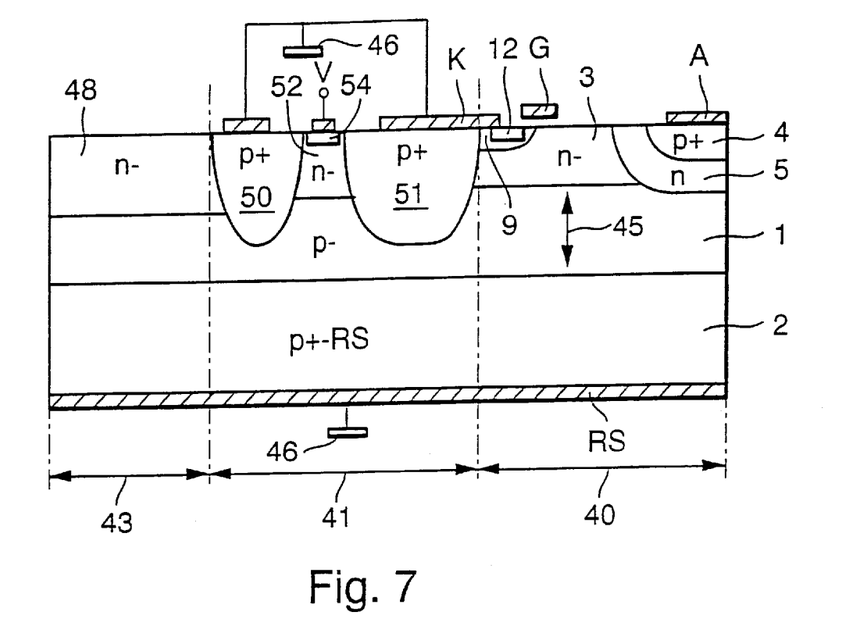
FIG. 7 shows another insulation arrangement.

FIG. 6 shows a detail 49 of a semiconductor chip having a region 40 in which is arranged an LIGBT of the type described previously. This LIGBT is shown only schematically, especially in the area of p-well 9. In addition, this also shows a rear side contact RS connected to ground 46 and applied to the rear side of semiconductor chip 49 in addition to gate electrode G and anode terminal A applied to anode region 4. Weakly p-doped region 1 has a layer thickness 45 of more than 10 $\mu$m in the area of region 40. There is also a region 43 where additional LIGBTs or a logic circuit can be arranged. Additional n-region 48 may be designed thicker in comparison with n-region 3 of region 40 or it may have a different concentration of dopant. Therefore, n-region 3 is designed to be relatively thin in region 40 only because a resurf arrangement leads to another advantageous embodiment of the component according to an exemplary embodiment of the present invention in particular, as described already in German Published Patent Application 197 25 091. Region 43 is separated from region 40 by an insulation arrangement 41. This insulation arrangement 41 has a strongly p-doped wall 47, completely permeating weakly n-doped region 48 as well as weakly n-doped region 3 and electrically connected to weakly p-doped region 1. P-wall 47 is short-circuited with cathode terminal K and is connected to reference potential 46 (ground). In FIG. 7, insulation arrangement 41 does not have one closed p-wall 47 but instead has two partial walls 50, 51 laterally enclosing a weakly n-doped region 52. This laterally enclosed n-region 52 receives a positive protection potential V. Insulation arrangement 41 in FIGS. 6 and 7 encloses at the edges the LIGBT which is arranged in region 40. In FIG. 7, region 40 is also shielded by p-wall 50 only toward region 43. N-region 52 is completely surrounded laterally by p-walls 50 and 51; regions 50 and 51 are connected by additional strongly p-doped regions in front of and behind the plane of the drawing in FIG. 7 (not shown), so that n-region 52 is completely encircled laterally by strongly p-doped regions.

Insulation arrangements 41 according to FIGS. 6 and 7 are suitable in particular for conductivity-modulated power components such as LIGBTs with a high blocking ability and use the layer sequence of weakly p-doped substrate 1 on strongly p-doped region 2 which is compatible with the LIGBT. The strongly p-doped walls introduced from the top of the chip, like strongly p-doped layer 2 arranged on the rear side of the chip, draw off holes which assume a portion of the current transport within the chip, in particular in the LIGBT. To minimize the on-state voltage drop of the LIGBT, insulation arrangement 41 can be used only at the periphery of the output stage(s). At the edge of the chip, the insulation arrangement also at the same time fulfils the function of a defined edge closure. Furthermore, an intermediate region 52 which is also provided, as shown in FIG. 7, may receive a positive potential V and may be used to draw off part of the electrons carrying part of the total current. Strongly p-doped region 2 on the rear side of the chip also draws holes off to deep walls 47, 51, 50 and thus, together with them, connects the insulation region well to ground. Deep n-region 52 shown in FIG. 7, which is connected to positive voltage V by a strong n-doping zone 54, also draws off electrons. A lateral current flow and thus a transverse influence on regions 40 and 43 are effectively shielded. Insulation arrangements 41 are compatible with buried layers for insulation in the area of logic circuits arranged in regions 43. These insulation arrangements can also be used with semiconductor components which have, instead of island structures, intermeshed finger structures for the anode and cathode, as described in German Published Patent Application 197 25 091, for example.

Figure 8:
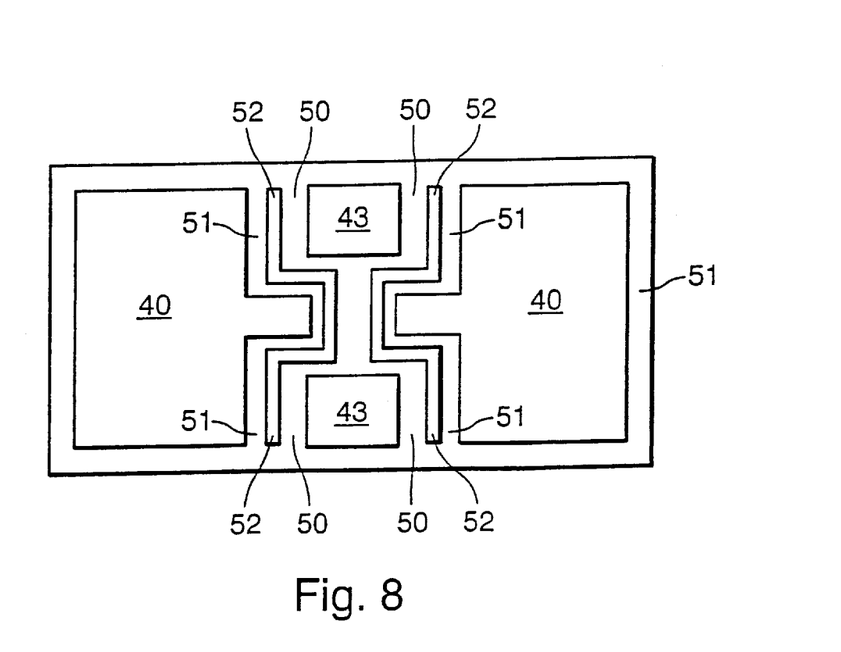
FIG. 8 shows a top view of an insulation arrangement.

FIG. 8 shows as an example a top view of a semiconductor arrangement having two LVIGBT regions 40 between which are arranged two logic regions 43. The edge of the arrangement and regions 40 are surrounded by partial wall 51, while logic regions 43 are also separated from the LVIGBT regions by another partial wall 50. Intermediate region 52 which was already described above and receives a protection potential is located between partial walls 50 and 51. The contacts of the partial walls not shown in FIG. 8 are connected to a common ground point so that first regions 50 and 51 are electrically connected and then finally the common contacts of regions 50 and 51 are joined. The common ground point may be arranged inside or outside the chip. In the latter case, the contacts of regions 50 and 51 are carried over wire bonds to legs of the housing of the integrated arrangement and then are connected externally. Crosstalk between LVIGBT regions or between the LVIGBT regions and logic regions 43 is minimized by such separate ground leads. Such crosstalk develops due to voltage drops at the ground metallization when a high current is carried over it in operation. The different grounds should therefore be joined more or less in a star shape only at a common point.

What is claimed is:

1. A field-controlled semiconductor component for use as a lateral-insulated gate bipolar transistor, the component comprising:
    a p-layer;
    an n-region having at least one p-well and an anode region, the n-region being arranged on a front side of the p-layer and the at least one p-well having a channel region controllable by a gate electrode; and
    at least one strongly n-doped cathode region being embedded in the at least one p-well, wherein:
        the at least one strongly n-doped cathode region is in a ring shape and runs parallel to an edge of the at least one p-well,
        the at least one strongly n-doped cathode region has at least one of an interruption and a recess in at least one location, and
        the at least one strongly n-doped cathode region of the at least one p-well adjacent to the anode region has an interruption along an entire side facing the anode region.

2. The component of claim 1, wherein:
    one of the at least one p-well is at least one of rectangular and square in shape; and
    the at least one of an interruption and a recess in the cathode region is arranged at at least one corner.

3. The component of claim 1, including a p-channel embedded in the n-region between the at least one p-well and the anode region.

4. The component of claim 1, including:
    a first group of channel regions controllable by a clamp gate; and
    a second group of channel regions controllable by a control gate electrically insulated from the clamp gate.

5. The component of claim 4, further comprising:
    an external inductive load coupled in series;
    a control circuit having a control input for receiving a control signal; and
    a clamp circuit coupled to an anode terminal;
    wherein at least one of the clamp gate and the control gate is controllable as a function of an anode potential and the control signal by using at least one of the clamp circuit and the control circuit.

6. The component of claim 1, further comprising:
    an insulation arrangement, wherein:
        the at least one p-well and the anode region are completely surrounded laterally by the insulation arrangement; and
        the insulation arrangement having a strongly p-doped wall completely enclosing the anode region, permeating surrounding n-regions, being coupled to the p-layer and being short-circuited with the at least one strongly n-doped cathode region, the strongly p-doped wall having two partial walls in sections for enclosing an intermediate region receiving a positive protection potential.

7. A field-controlled semiconductor component for use as a lateral-insulated gate bipolar transistor, the component comprising:
    a p-layer;
    an n-region having at least one p-well and an anode region, the n-region being arranged on a front side of the p-layer and the at least one p-well having a channel region controllable by a gate electrode; and
    at least one strongly n-doped cathode region being embedded in the at least one p-well, wherein:
        the at least one strongly n-doped cathode region is in a ring shape and runs parallel to an edge of the at least one p-well,
        the at least one strongly n-doped cathode region has at least one of an interruption and a recess in at least one location, and
        the at least one strongly n-doped cathode region of the at least one p-well adjacent to the anode region has an interruption along an entire side facing the anode region; wherein:
        the n-region has a strongly p-doped wall permeating surrounding n-regions, being coupled to the p-layer and being short-circuited with the at least one strongly n-doped cathode region, the strongly p-doped wall being part of an insulation arrangement completely laterally surrounding the at least one p-well and the anode region; and
    the p-layer is covered on a side opposite the n-region by a strongly p-doped region so that at least part of the strongly p-doped region functions as a part of the insulation arrangement so that holes for electrically insulating a region surrounding the insulation arrangement are drawable off by the strongly p-doped wall and also over the strongly p-doped region.

8. The component of claim 7, wherein the strongly p-doped wall has two partial walls in sections for enclosing an intermediate region receiving a positive protection potential.

9. The component of claim 7, wherein:
    n-dopings and p-dopings of the component are exhanged; and
    all potentials deviating from a ground reference potential have an opposite polarity.

10. A field-controlled semiconductor component comprising:
    a p-layer;
    an n-region having at least one p-well and an anode region, the n-region being arranged on a front side of the p-layer and the at least one p-well having a channel region controllable by a gate electrode; and
    an n-doped cathode region being embedded in the at least one p-well, wherein:
        the n-doped cathode region is in a ring shape and runs parallel to an edge of the at least one p-well,
        the n-doped cathode region has at least one of an interruption and a recess in at least one location, and
        the n-doped cathode region of the at least one p-well adjacent to the anode region has an interruption along a side facing the anode region.

11. The component of claim 1, wherein:
    n-dopings and p-dopings of the component are exchanged; and all potentials deviating from a ground reference potential have an opposite polarity.

12. The component of claim 10, wherein:

n-dopings and p-dopings of the component are exchanged; and all potentials deviating from a ground reference potential have an opposite polarity.

13. The component of claim 1, including a p-channel embedded in the n-region between the at least one p-well and the anode region;

wherein:
one of the at least one p-well is at least one of rectangular and square in shape; and
the at least one of an interruption and a recess in the cathode region is arranged at at least one corner.

14. The component of claim 13, including:

a first group of channel regions controllable by a clamp gate; and a second group of channel regions controllable by a control gate electrically insulated from the clamp gate.

15. The component of claim 14, further comprising:

an external inductive load coupled in series;

a control circuit having a control input for receiving a control signal; and a clamp circuit coupled to an anode terminal;

wherein at least one of the clamp gate and the control gate is controllable as a function of an anode potential and the control signal by using at least one of the clamp circuit and the control circuit.

16. The component of claim 1, wherein the gate electrode is made of polysilicon.

17. The component of claim 1, wherein the lateral-insulated gate bipolar transistor is a lateral-vertical-insulated gate bipolar transistor.

* * * * *

UNITED STATES PATENT AND TRADEMARK OFFICE
CERTIFICATE OF CORRECTION

PATENT NO. : 6,794,689 B1
DATED : September 21, 2004
INVENTOR(S) : Wolfgang Feiler

Page 1 of 1

It is certified that error appears in the above-identified patent and that said Letters Patent is hereby corrected as shown below:

Column 1,
Line 26, change "of the present invention the present invention" to -- of the present invention --.
Line 48, change "of to the present invention" to -- of the present invention --.

Signed and Sealed this

Twenty-seventh Day of December, 2005

JON W. DUDAS
*Director of the United States Patent and Trademark Office*